United States Patent [19]
Barth, Jr. et al.

[11] Patent Number: 5,663,924
[45] Date of Patent: Sep. 2, 1997

[54] BOUNDARY INDEPENDENT BIT DECODE FOR A SDRAM

[75] Inventors: John Edward Barth, Jr., Williston; Howard Leo Kalter, Colchester, both of Vt.

[73] Assignee: International Business Machines Corporation, Armonk, N.Y.

[21] Appl. No.: 572,604

[22] Filed: Dec. 14, 1995

[51] Int. Cl.⁶ ................................... G11C 8/00
[52] U.S. Cl. ............... 365/230.03; 365/230.06; 365/236
[58] Field of Search .................. 365/230.01, 230.03, 365/230.06, 233, 189.12, 236

[56] References Cited

U.S. PATENT DOCUMENTS

| | | | |
|---|---|---|---|
| 4,152,780 | 5/1979 | Eberlein | 365/238 |
| 4,285,035 | 8/1981 | Kindell et al. | 364/200 |
| 4,502,111 | 2/1985 | Riffe et al. | 364/200 |
| 4,722,047 | 1/1988 | Chan et al. | 364/200 |
| 4,860,197 | 8/1989 | Langendorf et al. | 364/200 |
| 4,888,679 | 12/1989 | Fossum et al. | 364/200 |
| 4,920,483 | 4/1990 | Pogue et al. | 364/200 |
| 5,043,874 | 8/1991 | Gagliardo et al. | 364/200 |
| 5,068,880 | 11/1991 | Kline et al. | 375/116 |

FOREIGN PATENT DOCUMENTS 63-192150  8/1988  Japan.

*Primary Examiner*—David C. Nelms
*Assistant Examiner*—Trong Quang Phan
*Attorney, Agent, or Firm*—Charles W. Peterson, Jr.; H. Daniel Schnurmann

[57] ABSTRACT

A boundary independent decoder for a Synchronous Dynamic Random Access Memory (SDRAM) with an n bit burst transfer block length. A user, usually a processor or microprocessor requests access to a block of SDRAM memory. The requested block may begin between array decode boundaries. A column address is decoded by an SDRAM column decoder. The decoder selects a starting boundary for 2n bits. The first requested bit is in the first n bits of the 2n selected bits. Thus, the entire n bit block is included in the selected 2n bit block. The n bit block is selected from the selected 2n bits and latched in a high speed decoder/register in a sequentially scrambled order, i.e., the $i^{th}$ bit is the first requested bit and the requested bit order is $i, \ldots, (n-1), \ldots, 0, \ldots, (i-1)$. Latched data is scrambled either sequentially or interleaved, if required. Scrambled data is burst transferred off chip.

17 Claims, 11 Drawing Sheets

| A1 | A0 | 00 | 0X | $\overline{11}$ |
|---|---|---|---|---|
| 0 | 0 | 1 | 1 | 1 |
| 0 | 1 | 0 | 1 | 1 |
| 1 | 0 | 0 | 0 | 1 |
| 1 | 1 | 0 | 0 | 0 |

BOUNDARY INDEPENDENT BIT DECODE FOR A SDRAM

FIELD OF THE INVENTION

The present invention relates generally to semiconductor memories and more particularly to bit decoders for semiconductor memories.

BACKGROUND OF THE INVENTION

Computer system performance depends upon processor performance and memory performance. Various ways (e.g., pipelining) are known to improve processor performance. Usually, the processor runs faster than the system's Dynamic Random Access Memory (DRAM). So, the DRAM is the normal gate to system performance. Increase DRAM performance and system performance improves. Therefore, high performance DRAM is always at a premium. However, DRAM performance still does not match processor performance. For this reason, a primary concern of memory chip designers is performance. Since DRAM performance does not match processor performance, high performance system designers have resorted to other approaches to reduce memory access time.

One such approach, known as caching, is to place fast Static Random Access Memory (SRAM) between the processor and the system memory, DRAM. Large blocks of data, typically 64 k–512 k bytes, are transferred from the DRAM to the faster SRAM cache. Provided that processor operation can be confined to data and instructions in the cache, the SRAM cache can match or nearly match processor speed. However, adding the cache complicates the system and, increases system cost.

In an attempt to eliminate the SRAM cache and its associated system complication and increased cost, several prior art approaches have been used to improve the DRAM's performance to allow coupling the system memory directly to the processor. One such prior art approach is known as Page Mode operation. In Page mode, column addresses are toggled and data from a single row is transferred into or out of the DRAM with the Column Address Strobe ($\overline{CAS}$) clock signal. In Page Mode, one data bit for each active data out is transferred during each $\overline{CAS}$ cycle.

A variation on Page Mode is Nibble Mode. In Nibble Mode, addresses are not changed in every $\overline{CAS}$ signal, but one data bit is still provided for every $\overline{CAS}$ cycle. The Nibble Mode data rate is doubled over Page Mode by providing the RAM with a special input clock signal, Toggle or TOG. Data is transferred on every rising as well as every falling transition of TOG, approximately doubling the data rate over Page Mode. Addresses change only for every other bit of data.

A Synchronous DRAM (SDRAM) is yet another approach to improving DRAM data transfer rate. In an SDRAM, a block of data is serially transferred at the rising edge of a continuously running clock signal. A starting column address is passed to the SDRAM and then, one or more clock periods later, a string of 4, 8 or more data bits are transferred starting from that particular addressed column. The data transfer length is called the Burst Length. An SDRAM must accept an address every other clock cycle. This requirement is known as the 2N rule. Typical SDRAM's provide bursts of data in 4, 8 or full page.

Typical prior art SDRAM architectures are either a pre-fetch architecture or a pipeline architecture. Data blocks are provided in bursts that may be ordered in what is termed an "interleaved" scramble or in a "sequential" scramble. Table 1 represents sequential scramble for a 4-bit block with each bit indicated by a numeral, 1–4, indicating its position relative to the block starting address. There are four possible combinations (cases) of bit order for 4 bits of sequentially scrambled data. As the name implies, sequentially scrambled data is scrambled only in that the starting bit for the burst may be any bit in the block and is not restricted to one bit in particular.

TABLE 1

| CASE # | | | | |
|---|---|---|---|---|
| 1) | 1 | 2 | 3 | 4 |
| 2) | 2 | 1 | 4 | 3 |
| 3) | 3 | 4 | 1 | 2 |
| 4) | 4 | 3 | 2 | 1 |

TABLE 2

| CASE # | | | | |
|---|---|---|---|---|
| 1) | 1 | 2 | 3 | 4 |
| 2) | 2 | 3 | 4 | 1 |
| 3) | 3 | 4 | 1 | 2 |
| 4) | 4 | 1 | 2 | 3 |

Table 2 represents four possible interleave scramble bit combinations. An interleaved scramble may also start the burst on any bit in the block. However, unlike the sequential scramble, the bit order for the burst is not necessarily sequential. For either scramble, the data must be scrambled (re-ordered) on the SDRAM before it is passed off-chip.

For a pipelined SDRAM, in order to provide the correct internal selection, its internal address bus must switch on each clock cycle. So, the scramble decode logic must operate at clock speed. Since this decode logic switches so frequently, it accounts for an appreciable percentage of chip transient power. Further, the clock must be routed to pipeline registers throughout the SDRAM that synchronize on-chip circuit operations. There are variations in clock driver loads and in wiring paths that introduce some on-chip clock skew. This clock skew reduces the time available for logic operations between pipeline registers. Therefore, it is difficult to scramble the burst data on chip at clock speed.

By contrast, on a pre-fetch architecture SDRAM, addresses are decoded every other clock cycle. The decode may be done in two clock cycles instead of one. So, a longer period of time (2 clock cycles) is available for address decoding. As a result, switching power is lower because addresses switch every other cycle. Thus, a pre-fetch SDRAM has a less stringent timing requirement by about a factor of two for data scrambling logic as compared to a pipelined SDRAM. Relaxation of this speed requirement is a derivation of the 2N rule. Further, the clock is required at fewer points on a pre-fetch chip than on a pipelined chip because there are fewer pipeline stages, if any, on a pre-fetch chip. Thus, a pre-fetch SDRAM uses less transient power than a pipelined SDRAM.

However, pipelined SDRAMs have an advantage over Pre-Fetch SDRAMs for a full page-length burst block. A full page burst requires that a data transfer start at any address and continue until an entire page of data (usually about 1024 bits) is transferred. Pipelined SDRAMs queue data into the pipeline, and so, simply start the data transfer from the queue at the starting address.

By contrast, pre-fetch boundaries complicate the pre-fetching during full page bursts. This complication arises because the burst block start location, in all likelihood, will not align with a pre-fetch page boundary. Thus, if a user requests a page of sequential bits that are not aligned to a page boundary, multiple accesses are required. These multiple accesses cause delays, or gaps, between accesses, i.e., during the block transfer.

While this complication is most pronounced for full page burst operation of a pre-fetch SDRAM, it may be equally troublesome for smaller bust lengths. For example, in a chip organized for an eight bit burst block length, to transfer 8 bits, starting at bit 6 of one block, first requires accessing a first block, bits 0–7, to transfer bits 6 and 7 and, then, accessing a second block to transfer bits 0–5 of that second block. There is a delay, or gap, in between blocks because of the second block access.

SUMMARY OF THE INVENTION

It is a purpose of the present invention to improve Computer System Performance.

It is another purpose of the present invention to improve SDRAM flexibility.

It is yet another purpose of the present invention to improve pre-fetch SDRAM performance.

The present invention is a boundary insensitive block 5 decoder for a Synchronous Dynamic Random Access Memory (SDRAM) with an n bit burst transfer block length. The block decoder includes: a column decoder for decoding an array column address; bit selectors receiving the decoded column address and selecting a bit pair; and a starting address decoder for selecting one bit from each selected bit pair, each selected one bit being one of a block of bits. The selected data block has a width of n bits, n being an integer divisible by 2 and there are n selected bit selectors. The bit selectors may be pass gate multiplexers. The starting address decoder may be a pass gate multiplexer. The block decoder may also include a counter for counting each bit of the block of bits and a high speed decoder for selecting each bit of the block in an order determined by the counter. The block decoder may also include a register for holding the selected block of bits. The high speed decoder may select each bit in the selected block in an order determined by a block address. The high speed decoder may be a high speed decoder/register and may include: a sequential scramble decoder; an interleaved scramble decoder; at least two serially connected n bit registers; and, AND-OR logic to select data from the second n-bit registers in response to bit select signals from the sequential scramble decode or from the interleaved scramble decode. The sequential scramble decoder and the interleaved scramble decoder provide bit select signals in response to the block count from the counter.

DESCRIPTION OF THE PREFERRED EMBODIMENTS

In accordance with the present invention, an essentially boundary transparent burst transfer is achieved for an n bit burst by locally decoding both x and x+n, where n is the pre-fetch word size and x is the individual address of the bit within the burst block to be transferred. Depending on the boundary location within the pre-fetch word, either x or x+n is selected for transfer. So, if the boundary address within the pre-fetch word is less than or equal to the bit address, then x is selected; otherwise, the boundary address is greater than the bit address and x+n is selected. Thus, individual bit selection is a greater than or equal to function for the x addressed bit, while selection of x+n addressed bit is a less than function.

In the preferred embodiment of the present invention, a starting address for an n bit block of data is decoded. Based on the decoded starting address, a block of 2n bits are selected and provided in parallel. The starting address for the n bit burst falls at one bit location within the lowest n bits of the pre-fetched block. From the 2n bit block, n bits are selected (starting at the block starting address) and stored in a register. Data from the register is transferred to a processor in an n-bit burst.

By contrast, prior art SDRAMs required two individual sequential fetches, part of the block from the first fetch and the remainder from the second. There was a gap between these two fetches, in the middle of the burst. All of the requested block data was not available to the processor until after the second fetch. This gap in the two-fetch transfer increased average access time thereby impeding system performance. The present invention eliminates the need for two-fetch block transfers. Further, the present invention reduces chip power and column decode switching rate (which also reduces power) by making the second fetch unnecessary.

Figure 1A:
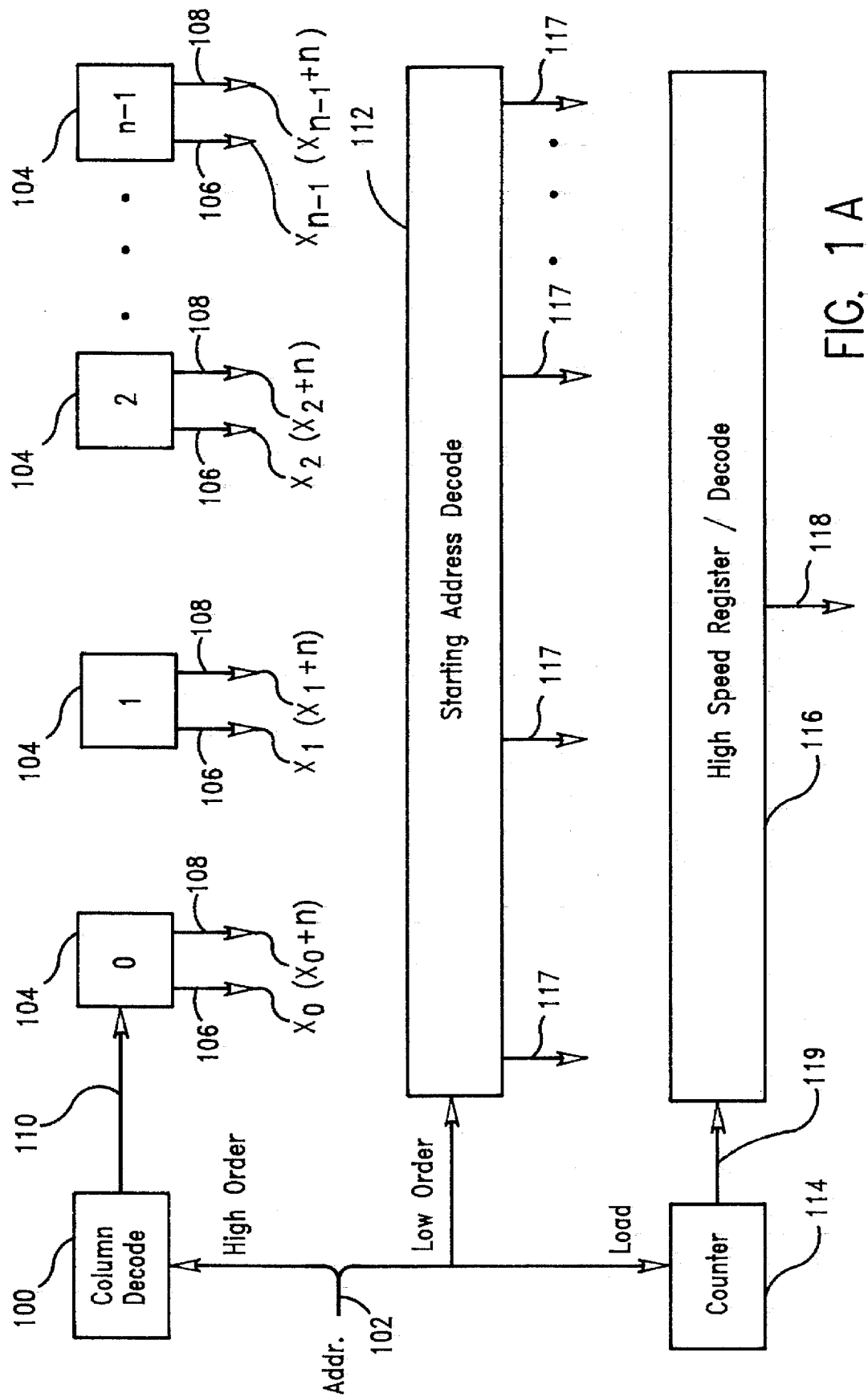
FIG. 1A is a block diagram of a boundary transparent decode according to the present invention.
Figure 1B:
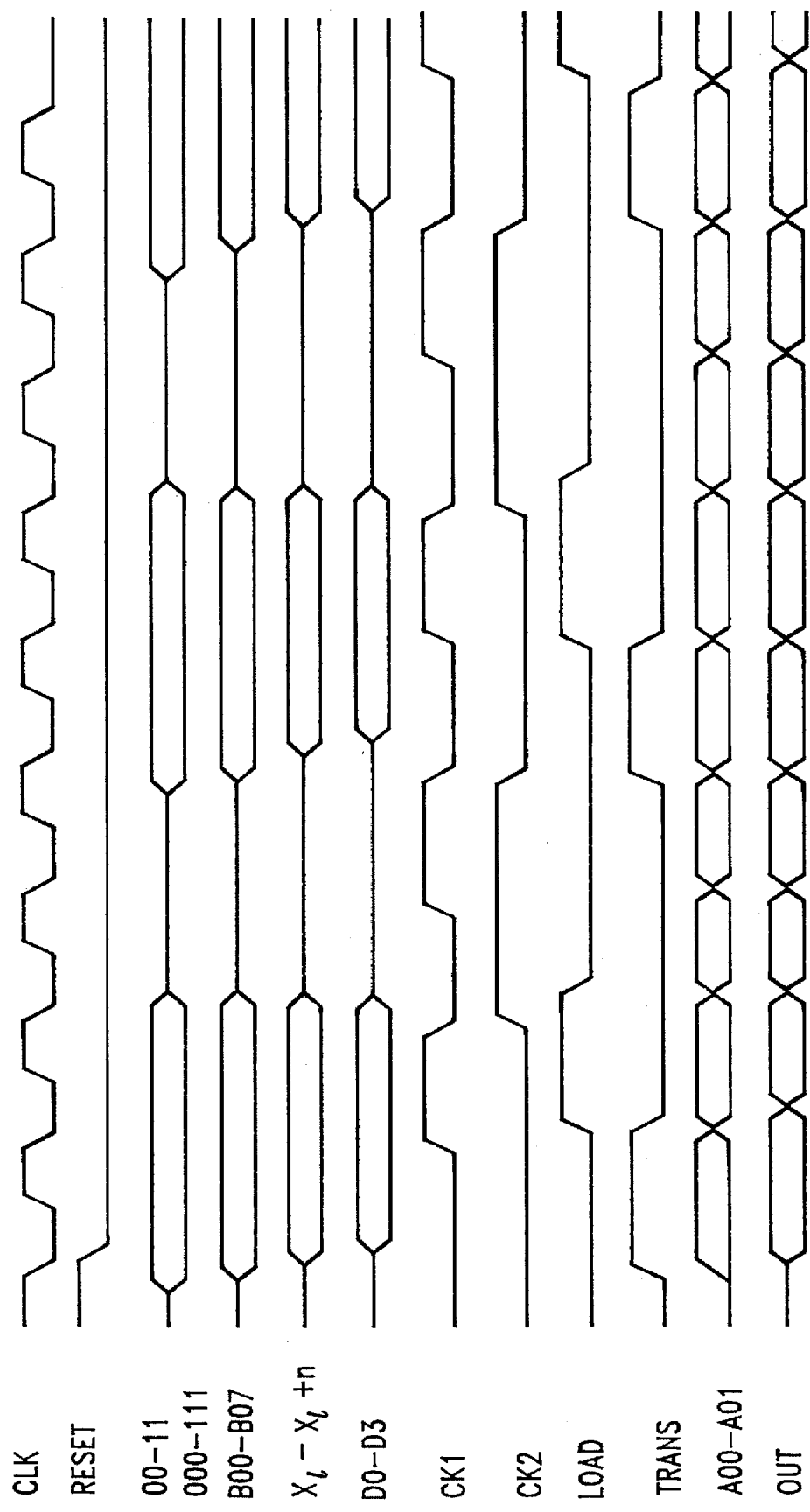
FIG. 1B is a timing diagram for the boundary transparent decode of FIG. 1A.

FIG. 1A is a block diagram of an n-bit block SDRAM decoder that is boundary independent according to the preferred embodiment of the present invention. The block decoder includes a column decoder 100 to decode and select an array column address 102. A boundary address $x_0$ is determined such that the requested burst block starting address $x_j$ is below $x_n$, i.e., $J=0 \leq i \leq n-1$. In the selected column, n bit pair selectors 104 select n pairs of data bits ($x_i$) 106 and ($x_i+n$) 108 according to the decoded column address on bus 110. A starting address decoder 112 selects an n bit block, one bit of each data bit pair 106, 108. A counter 114 maintains a block count during a burst transfer. A high speed decoder/register 116 latches and holds the selected n bit block of data from the starting address decode output 117. While the n bit block is selected and latched, the counter 114 passes a bit count on control lines 119 to select each bit of a previously selected n bit block that is currently held in the high speed decoder/register 116. Each bit of the previously selected block is transferred in sequence to output 118 and off-chip. FIG. 1B is a timing diagram for the boundary transparent decode of FIG. 1A.

First, the requested block address is passed on bus 102 to the column decoder 100 (high order address bits labeled 000–111, i.e., A02–A04 in FIG. 1B) and to the starting address decode 112 (low order address bits labeled 00–11, i.e., A00–A01 in FIG. 1B). The number of low order bits passed to starting address decode 112 is dependent upon burst block length. Thus, 2 low order bits are passed for a 4 bit block, 4 for a 16 bit block, etc. The numbering of high order bits is the number of bits in the column address, reduced by the number of low order bits provided to starting address decode 112. As the timing for partially decoded address signals 000–111 and 00–11 is essentially identical, they are not distinguished in FIG. 1B. An initialization signal (RESET) is passed from the address bus 102 to the counter 114. The column decoder 100 decodes the high order address bits to provide a select signal, on one of 2n outputs on bus 110. The select signal on bus 110 controls bit selection in each of n bit selector circuits 104.

Figure 2:
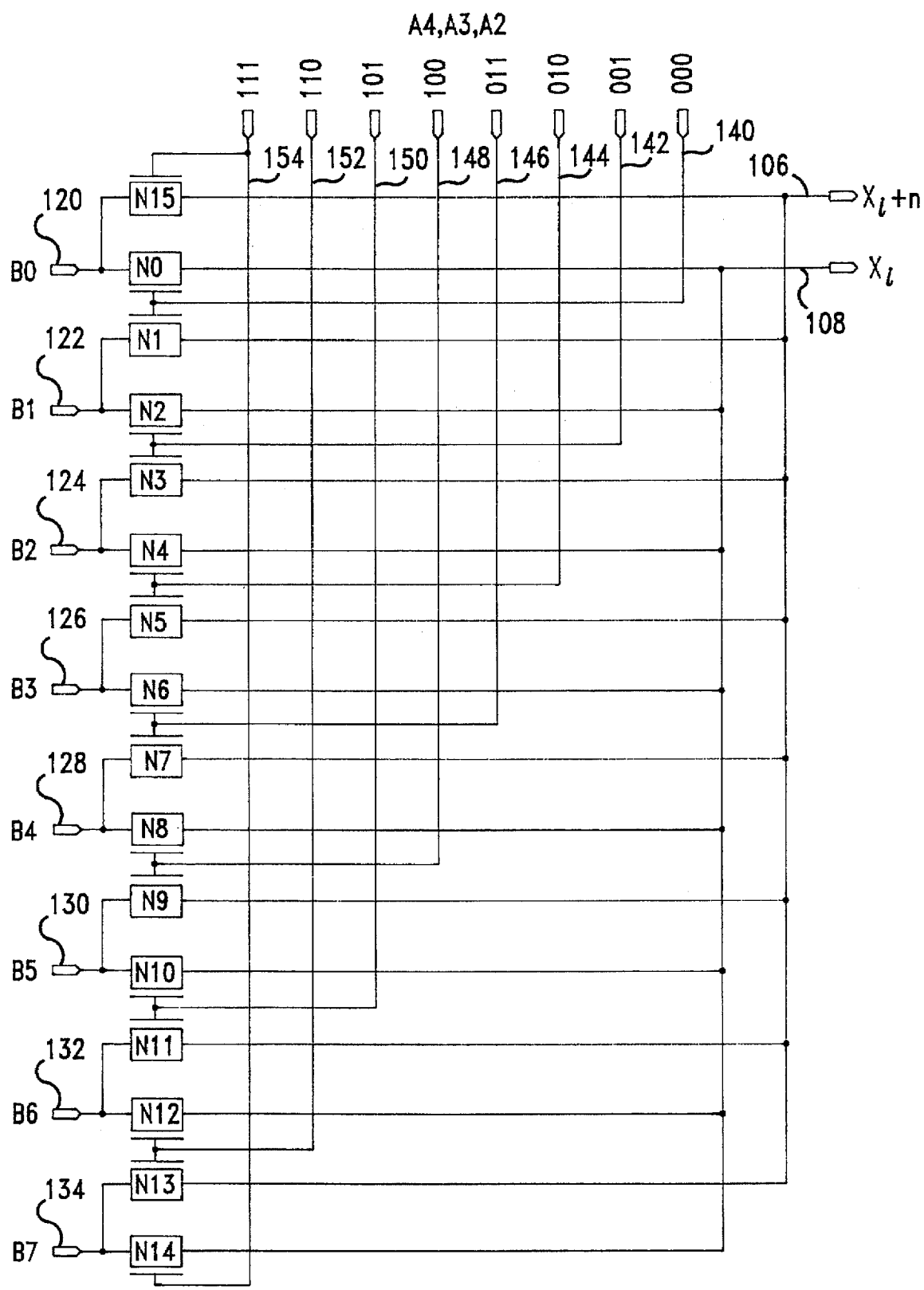
FIG. 2 is a schematic of a bit decoder according to the present invention.

Each bit selector 104 is, basically, a 2n to 2 multiplexer, as represented schematically in FIG. 2 with, for example, n=4. Each of the n bit selector circuits 104 receives 2n data bits B0, B1, . . . , B7 from a memory array. (These signals are shown in FIG. 1B.) The 2n inputs B0, B1, . . . , B7 are selectively passed through N-channel Field Effect Transistor (NFET) pass gates N0–N15. One of the select lines 000, 001, 010, . . . , 111 is driven high on output bus 110 from column decoder 100 to select and pass 2 of inputs B0, B1, . . . , B7 through pass gates N0–N15 to outputs $x_i$, shown as line 108, and $x_i+n$, shown as line 106, (see FIG. 1B). The high select line 000, 001, 010, . . . , 111 turns on two NFETs N0–N15, gating two selected input bits B0, B1, . . . , B7 to outputs $X_i$ and $x_i+10$.

Figures 3A, 3B:
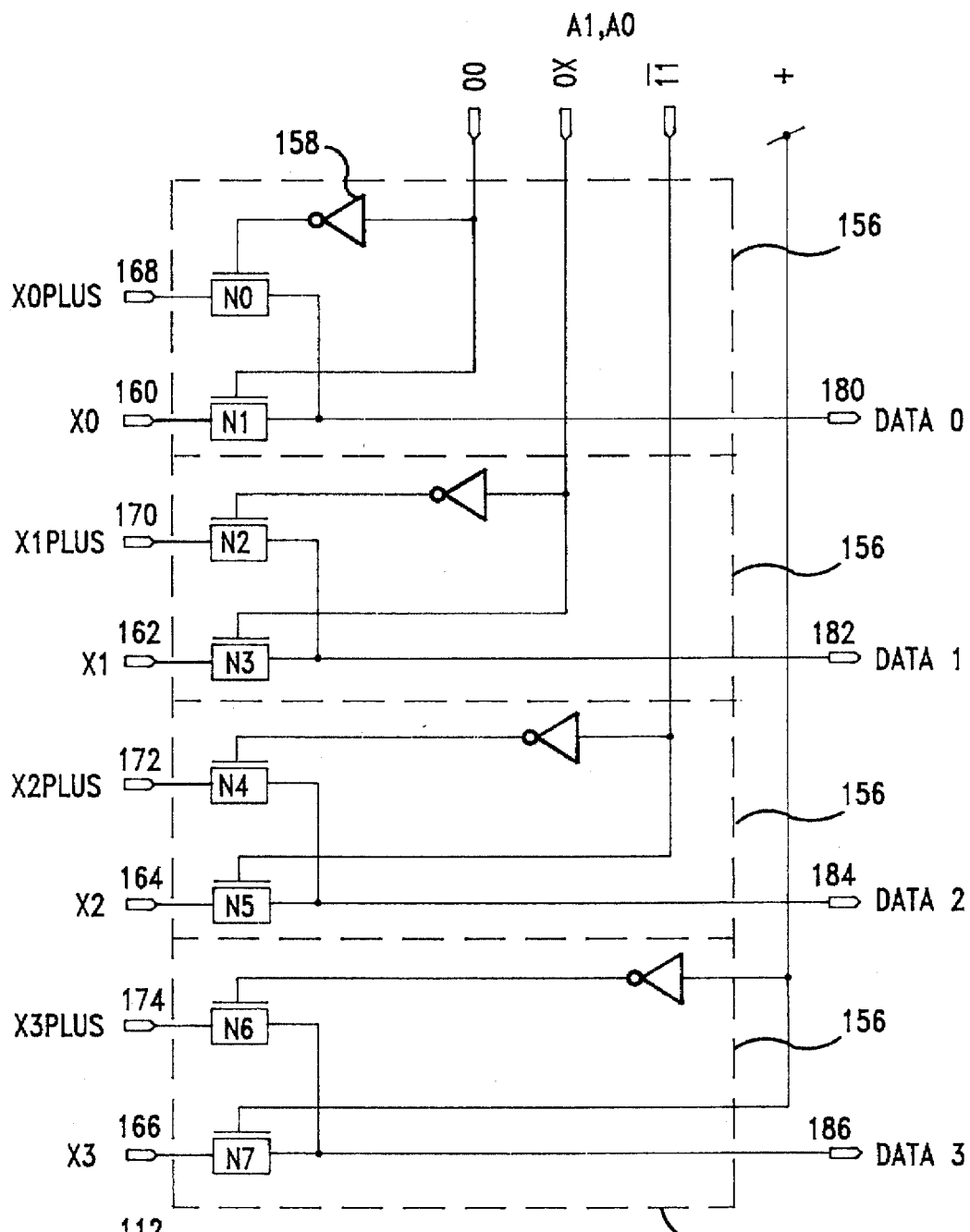
FIG. 3A is a schematic of a starting address decoder.
FIG. 3B is a truth table for the circuit of FIG. 3A.
Figure 4:
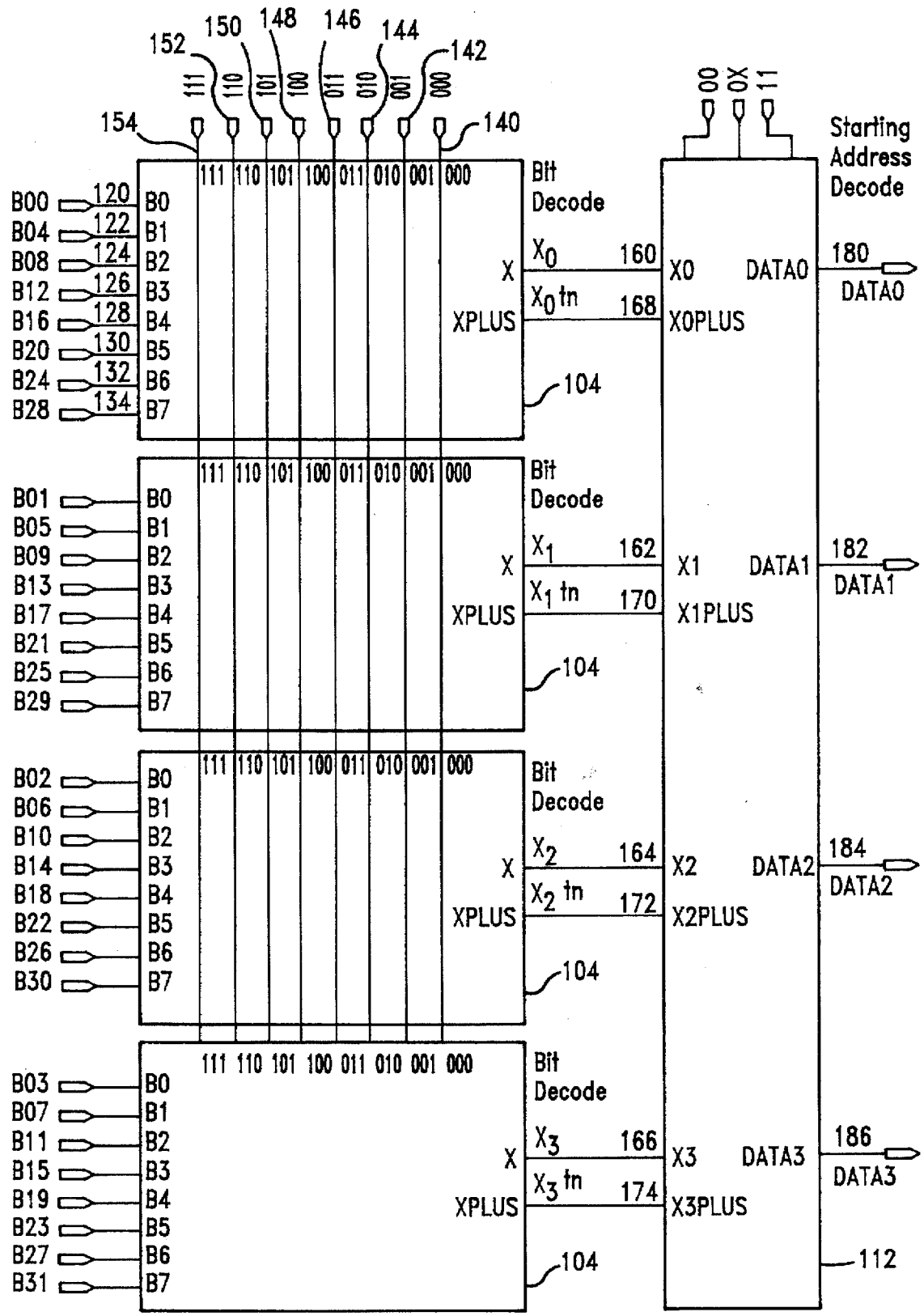
FIG. 4 is a block diagram of a 4 bit pre-fetch DRAM unit according to the present invention.

Continuing the example for n=4, the n pairs of selected $x_i$ and $x_i+n$ outputs, one pair from each bit selector 104, are inputs x0, x1, x2, x3, respectively shown as lines 160, 162, 164, 166, and x0plus, x1plus, x2plus, x3plus, respectively shown as lines 168, 170, 172, 174, to the starting address decoder 112. As represented schematically in FIG. 3A, the starting address decoder 112 is basically n 2 to multiplexers 156. Each 2 to 1 multiplexer 156 is a pair of NFETs N0–N7 and an inverter 158. Alternatively, starting address decoder 112 may be any 2n to n multiplexer. The 2n bit pair inputs (x0–x0plus); (x1, x1plus), (x2, x2plus) and (x3, x3plus), are each connected to one side of one of the pass gates N0–N7. Each 2 to 1 multiplexer 156 provides 1 of the n outputs 180, 182, 184, 186. These n outputs are labeled D0–D3 in FIG. 1B. Bit selection is done from the low order column address bits on address bus 102. These low order address bits are logically decoded and a select signal is generated according to the truth table in FIG. 3B. In each 2 to 1 multiplexer 156, the control signal decoded from the low order address bits, in combination with the inverter 158, selectively pass inputs (x0, x0plus), (x1, x1plus) and (x2, x2plus) through NFETs N0–N5 to outputs 180, 182, 184, respectively In this example, output 186 is treated differently than the other outputs because the block starting address is always below the $x_{n-1}+n$ bit address. The input to this last selector 188 is tied high, as indicated by the "+", to permanently select input 166 and permanently de-select input 174. Thus, optionally, selector 188 may be a simple direct connection (i.e. a wire) between 166 and 186. However, for load and delay balancing, preferably selector 188 is a 2 to 1 multiplexer as provided in FIG. 3A. FIG. 4 is a block diagram representing, for the present example, the connection of four previously described bit selectors 104 to the one previously described starting address decoder 112. Data inputs 120, 122, . . . , 130 and 134 are the same as those described in FIG. 2. Select lines 140, 142, 144, . . . , 154 are connected in parallel to the four bit selectors 104. Selected bits 160, 162, 164, . . . , 174 are passed to starting address decoder 112 and are controlled by inputs 00, 0X, . . . , as previously described in FIGS. 3A and 3B, generating outputs 180, 182, 184 and 186.

Figure 5:
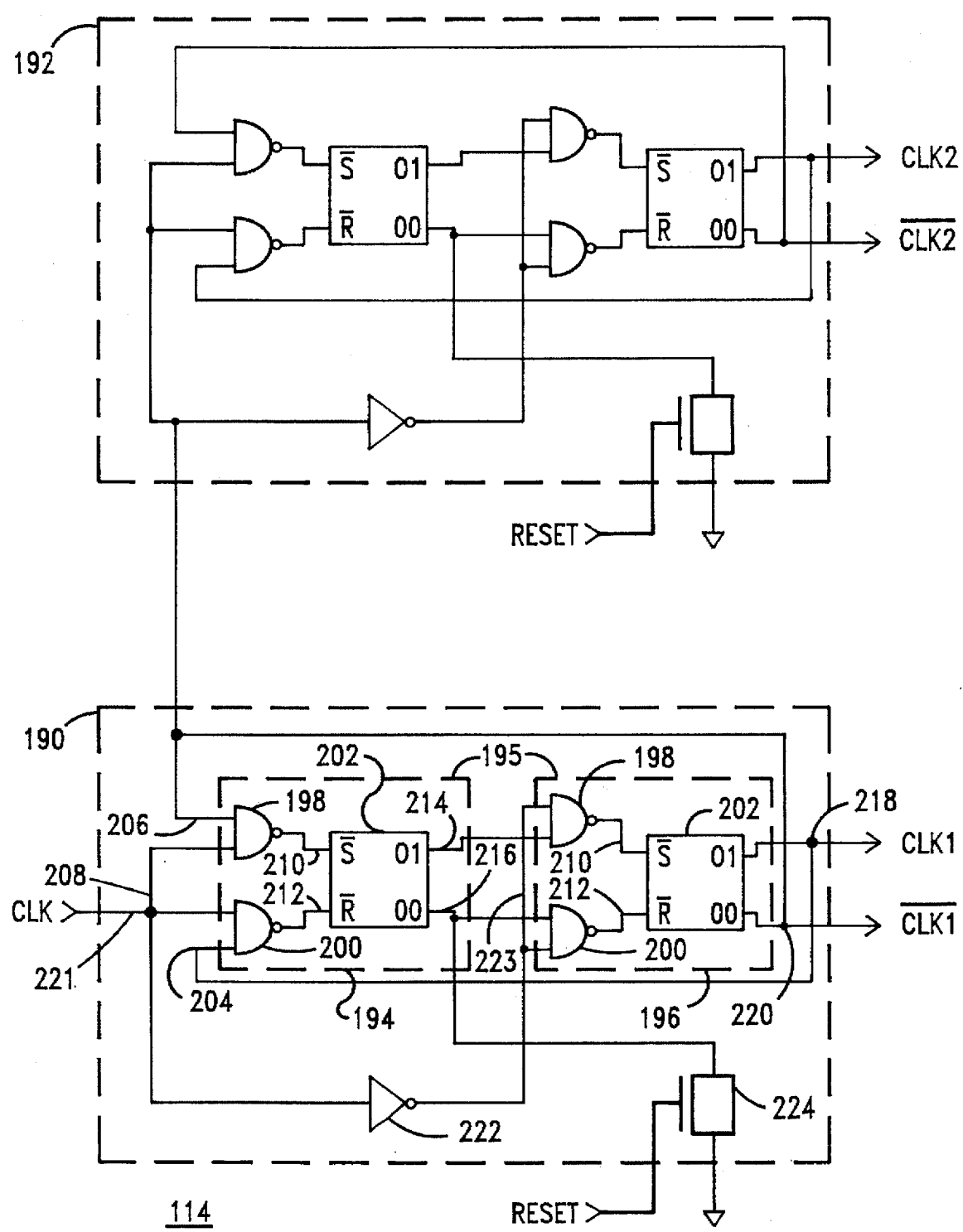
FIG. 5 is a schematic of a modulo n counter.

FIG. 5 is a schematic representation of a modulo n (n=4) counter 114 suitable for a 4 bit block transfer for the present example. The counter 114 is two identical serially connected Master-Slave S-R latches 190, 192. Each Master-Slave latch is a pair 194, 196 of identical serially connected, gated S-R latches. Each gated S-R latch is a pair of two input NAND gates 198, 200 and an inverted input S-R latch 202. The inverted input S-R latch 202 is a pair of cross coupled NAND gates (not shown) as are well known in the art. Each inverted input S-R latch 202 is set or reset by a low on its appropriate input 210, 212. Each input 204, 206 to each gated S-R latch 195 is NANDed with a clock 208 in NAND gates 198, 200 to generate inputs 210, 212 to inverted input S-R latch 202. The outputs 214, 216 from the first gated S-R latch 194 are the inputs to the second gated latch 196. The outputs 218, 220 from the second gated S-R latch 196 are inverted and fed back (swapped) as inputs to the first gated S-R latch 194. The outputs 218, 220 from each second gated S-R latch 196 are also clock outputs CLK1, $\overline{CLK1}$, CLK2 and $\overline{CLK2}$ from Master-Slave S-R latches 190, 192. The clock input 221 to the first gated S-R latch 194 is inverted in inverter 222 to provide the clock input 223 for the second gated S-R latch 196. An external control signal, RESET, is connected to the gate of NFET 224, which is connected, drain to source, between output 216 of inverted input latch 202 and ground. The inverted output 220 ($\overline{CLK1}$) of the first Master-Slave S-R latch 190 is the clock input for the second Master-Slave S-R latch 192. (Timing for clocks CLK 208, CLK1 218 and CLK2, are respectively labelled CLK, CLK1 and CLK2, in FIG. 1B.)

RESET, when high, turns on NFET 224 to reset the first latch 202, pulling its O0 output 216 low which, in turn, forces its O1 output 214 high. With RESET high, second gated S-R latch 196 resets, i.e., its O1 output 218 is driven low and its O0 output 220 is driven high, when the CLK input 208 to the Master-Slave S-R latch 195 is low. RESET may be pulsed once, upon power up, to initialize and synchronize the counter with all other simultaneously pulsed counters. Alternatively, RESET may be pulsed upon loading data into the High Speed Register/Decode 118. With RESET normally low, each Master-Slave S-R latch 190, 192 toggles at half its input clock rate. Thus, CLK2 (which is clocked by $\overline{CLK1}$) is the most significant bit and CLK1 is the least significant bit of a free running modulo 4 counter 114.

Figure 6A:
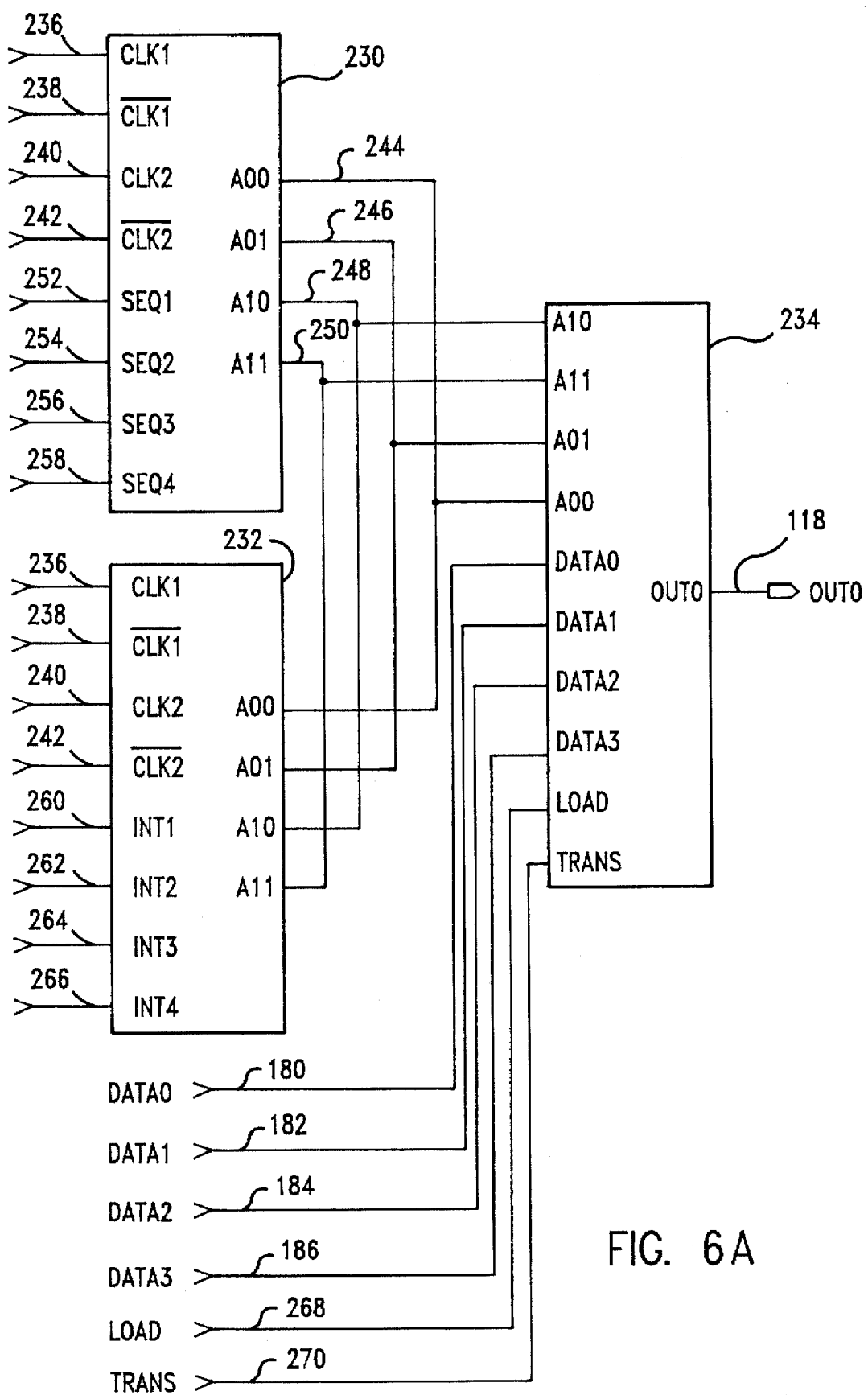
FIGS. 6A to 6D are schematic representations of a high speed decode register.

FIG. 6A is a block diagram of the High Speed Register/Decode 116 circuit, that includes, essentially, a sequential scramble selector 230, an interleaved scramble selector 232 and a parallel in/serial out register bank 234. Scramble decode is provided by the selectors 230, 232. The selectors 230, 232 receive the count outputs, CLK1, $\overline{CLK1}$, CLK2 and $\overline{CLK2}$ on lines 236, 238, 240 and 242 from the counter 114 and, based on a preselected scramble, provide select signals A00, A01, A10 and A11 on lines 244, 246, 248 and 250 to the parallel-in/serial-out register 234. Since the first requested bit may be any one of DATA0–DATA3, a sequential scramble may be required to provide the requested block in unscrambled order. A sequential scramble order is selected by an appropriate signal on one of lines 252, 254, 256 and 258. Alternatively, an interleaved scramble order is selected by an appropriate signal on one of lines 260, 262, 264 and 266. Data on lines 180–186 from the starting address decoder 112 is provided to the register 234. A high on LOAD line 268 latches data on lines 180, 182, 184 and 186 into the register bank 234. Simultaneously, a previously latched block of n bits is selected and passed sequentially out of the register bank 234 on output 118. Once the previously latched block is sequentially gated out of the register bank 234, a high on the TRANsfer control (TRANS) line 270 transfers the latched block internally to a serial out register. After the transfer, a subsequent block may be selected and latched while the present block is sequentially gated out. Timing for the control signals LOAD 268, TRANS 270 and OUTPUT 118, are shown in FIG. 1B, and are labelled LOAD, TRANS and OUT, respectively.

Figure 6B:
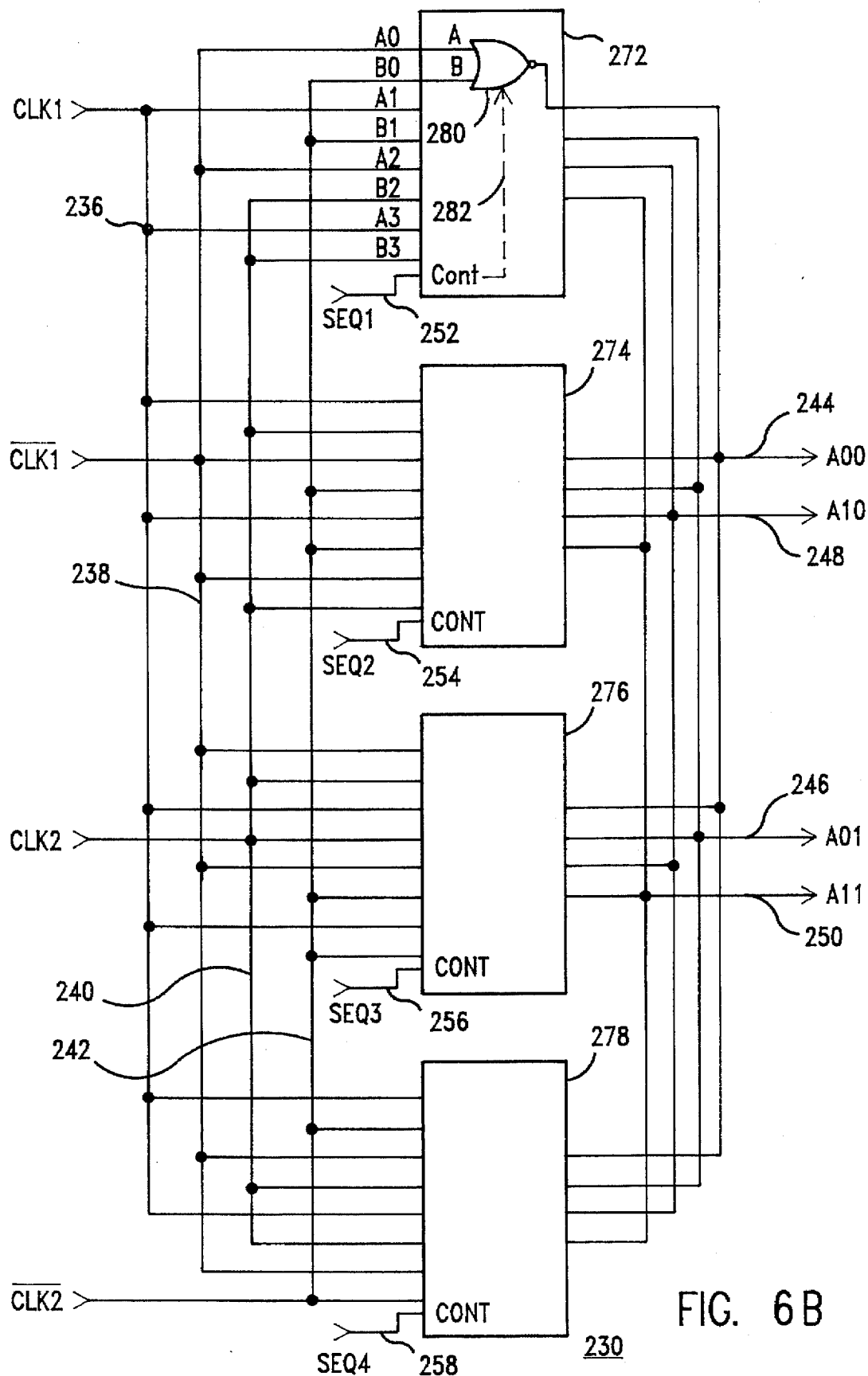
Figure 6C:
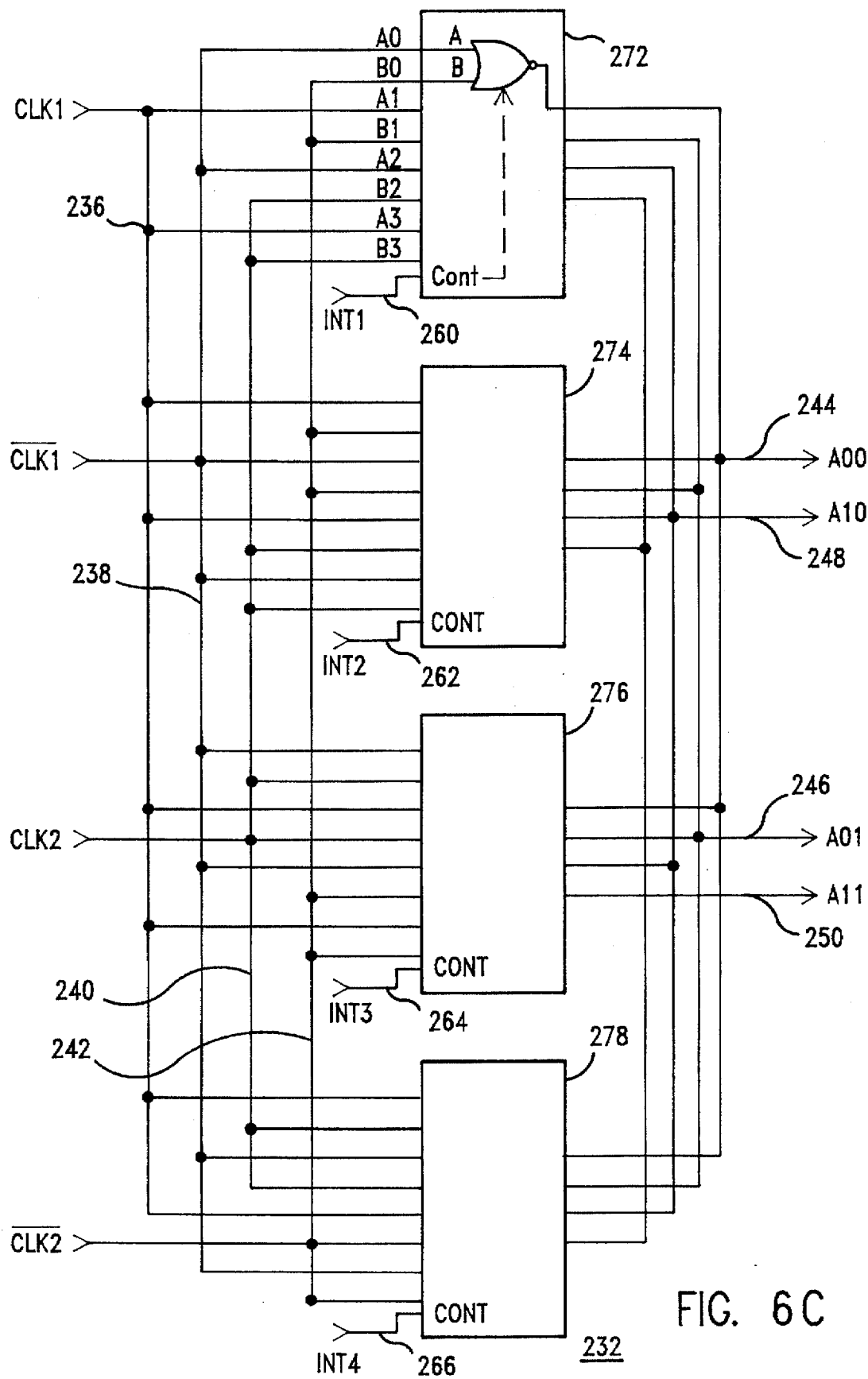

FIG. 6B is a block diagram of the sequential scramble selector 230. FIG. 6C is a block diagram of the interleaved scramble selector 232. These selectors 230, 232 are nearly identical. Each includes 4 two bit decoders 272, 274, 276 and 278. The primary difference between the two selectors 230, 232 is the connection of count inputs 236, 238, 240 and 242 to corresponding blocks 274 and 278. Each two bit decoder, e.g. in 272, includes 4 identical two input NOR gates each connected as represented by NOR gate 280. For simplicity, only, single NOR gate 280 is shown. In the preferred embodiment, the NOR gates 280 have tri-state outputs enabled by CONT 282. Alternatively, these NOR gates 280 could be open-drain three-input NOR gates or any circuit providing an equivalent logic function.

Figure 6D:
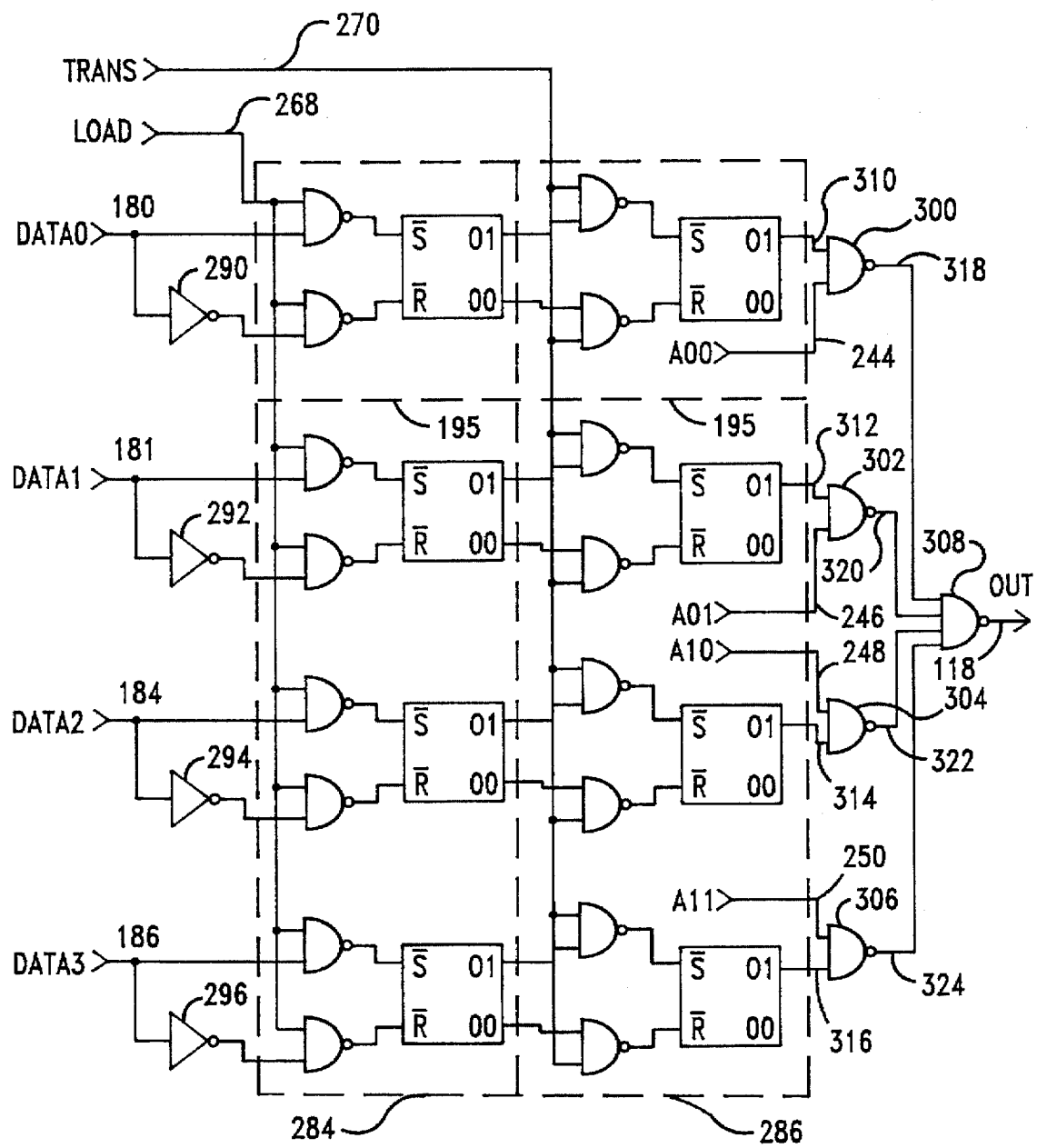

FIG. 6D is a block diagram of the parallel-in/serial-out register bank 284, which includes at least two n-bit registers 284, 286. Each n-bit register 284, 286 includes n gated S-R latches 195 as described above for the modulo n counter 114. The n bit registers 284, 286 are serially connected. LOAD 268 is the gate (clock) input for the first n bit register. Data data0, ..., data3 from the starting address decoder 112 are provided to the $\overline{S}$ inputs of the gated S-R latches 195 of the first n bit register 284. Inverters invert inputs 180, 182, 184 and 186 to provide the $\overline{R}$ inputs to the gated S-R latches 195. TRANS 270 is the clock input to the second n-bit register 286.

NAND gates 300, 302, 304, 306 and 308, provide an AND-OR function, combining each of the select signals A00, A01, A10 and A11 244–250 with one of second n-bit register 286 outputs 310–316 to generate a serial output 118. As each select signal 244–250 is driven high by the appropriate scramble selector 230, 232, the selected second n-bit register 286 output 310, 312, 314 and 316 is gated through one selected NAND gate. The outputs 318–324 of remaining unselected NAND gates 300–306 remain high. The outputs of NAND gates are nanded in NAND gate 308. So, if an output 318, 320, 322 and 324 of a selected NAND gate falls, then OUT, the output 118 of NAND gate 308, rises; otherwise, OUT remains low.

TRANS goes high to transfer a previously selected block, stored in first n-bit register 284, to second n-bit register 286. Once TRANS returns low, LOAD may rise to store a selected n bit block in the first n-bit register 284. Coincidentally with TRANS falling, the burst transfer may begin. So, the previously selected block in second n-bit register 286 may be gated off chip through NAND gates 300–308. As soon as the last bit in the block of data in the second n-bit register 286 is gated out, the next block, having been loaded in the first n-bit register 284, may be transferred to the second n-bit register 286 to continue the burst transfer. Thus, there is no gap in the burst transfer across the boundary or in burst transferring both blocks.

Figure 7:
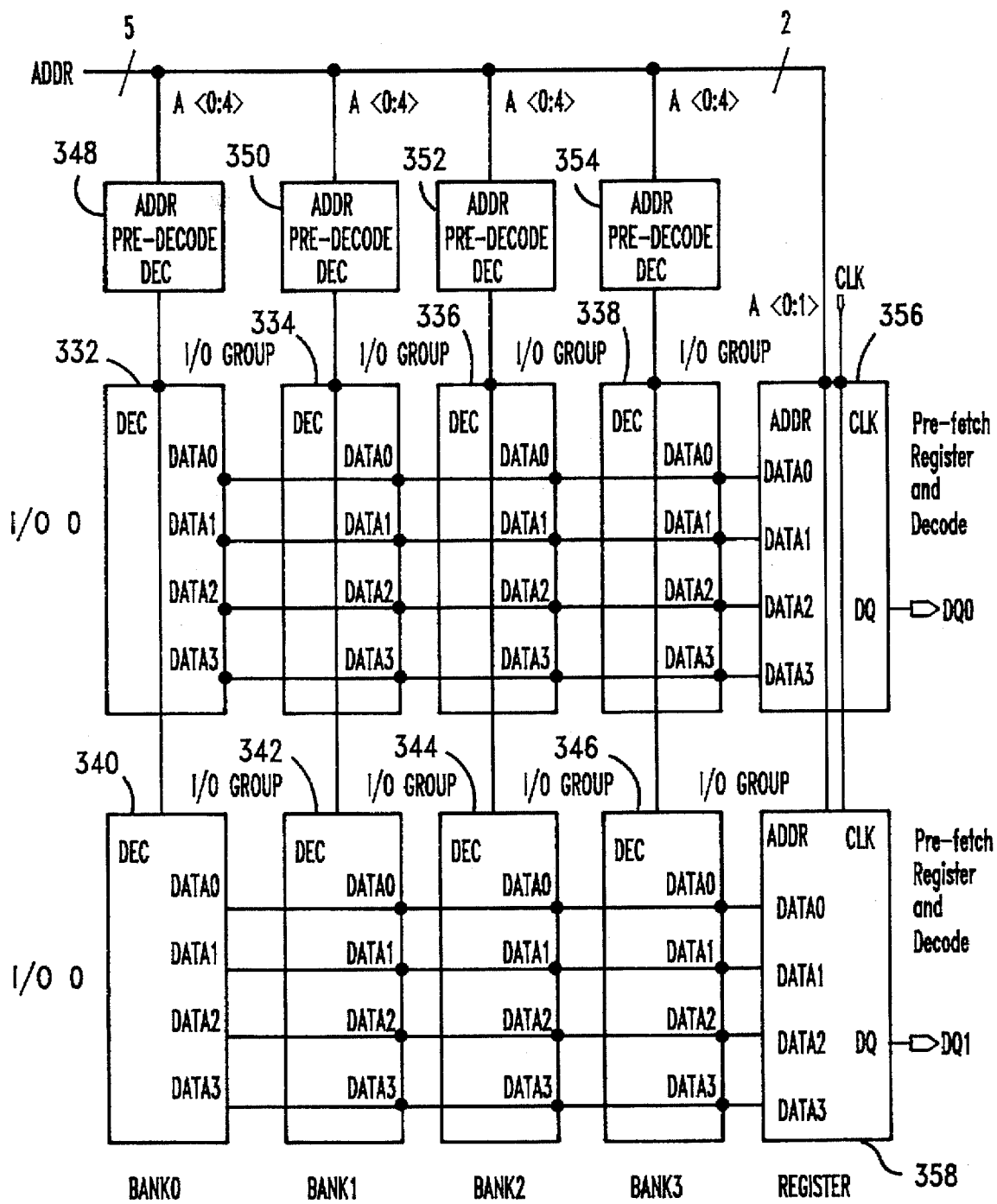
FIG. 7 is a block diagram of a SDRAM according to the present invention.

FIG. 7 is a block diagram of an example of an SDRAM 330 according to the preferred embodiment of the present invention wherein 8 individual DRAM banks 332, 334, 336, 338, ..., 346 are combined. Each bank could be, for example; 32 Mbits of a 256 Mbit SDRAM. Each pair of banks share an address pre-decode 348, 350, 352 and 354 that is essentially the same as column decoder 100. In this example, the 8 banks are grouped into two groups for 2 Data Outs (DQ0, DQ1). The path for each data out includes a pre-fetch register and decoder 356,358 that is comprised, essentially, of counter 114 and High Speed Register/Decoder 116. In addition, a means for disabling decode in unselected banks (not shown) is included. Unselected banks may be disabled simply by forcing the outputs of pertinent pre-decoders low. In addition, in this embodiment, for a non-full-page burst, A0 and A1 are used in the high speed register to select the scramble sequence. In a full page burst, A0 and A1 are used as the initial starting address with a sequential scramble and addresses A2 through A4 are incremented every fourth clock for $2^5$ clocks (32 clock cycles) of CLK 208.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A decoder for selecting a block of Random Access Memory (RAM), said decoder comprising:
    a column decoder for decoding an array column address;
    a plurality of bit selectors responsive to said decoded column address each said bit selector selecting a bit pair; and
    a starting address decoder for selecting one bit from each selected said bit pair, each selected said one bit being one of a block of bits.

2. The decoder of claim 1 wherein the block of bits has a width of n bits, n being an integer, and the plurality of bit selectors is n bit decoders.

3. The decoder of claim 2 wherein each of said plurality of bit selectors is a pass gate multiplexer.

4. The decoder of claim 2 wherein the starting address decoder is a pass gate multiplexer.

5. The decoder of claim 1 further comprising:
    a counter for counting each bit of said block of bits; and
    a high speed decoder for selecting each bit of said block responsive to said counter.

6. The decoder of claim 5 further comprising a register for holding said selected block of bits, said high speed decoder selecting each bit in said selected block in an order determined by a block address.

7. The decoder of claim 6 wherein the counter is a modulo n counter and comprises a pair of serially connected Master-Slave latches.

8. The decoder of claim 6 wherein the register is a register bank of at least 2 serially connected n bit registers.

9. A Synchronous Dynamic Random Access Memory (SDRAM), having a plurality of memory banks, each said memory bank having a decoder for selecting an accessed n bit block of data, n being an integer divisible by 2, said decoder comprising:
    a column decoder for decoding an array column address;
    a plurality of bit selectors, said decoded column address selecting n of said plurality of bit selectors, each selected said bit selector selecting a bit pair;
    a starting address decoder for selecting an n-bit block of bits, each selected bit of said block being selected from one of said bit pairs from said n selected bit selectors;
    a modulo n counter for maintaining a block count; and
    a high speed decoder/register for receiving said selected n-bit block and for holding at least one previously selected block of data, each bit in one said at least one previously selected block of data being responsive to said block count.

10. The SDRAM of claim 9 wherein each of said bit selectors is a pass gate multiplexer.

11. The SDRAM of claim 10 wherein the starting address decoder is a pass gate multiplexer.

12. The SDRAM of claim 11 wherein said modulo n counter comprises serially connected S-R latches.

13. The SDRAM of claim 12 wherein the high speed decoder/register comprises:

a sequential scramble decoder;

an interleaved scramble decoder;

at least a first n bit register serially connected to a second n bit register; and an AND-OR decoder receiving data from said second of said serially connected n-bit registers and providing selected outputs therefrom responsive to bit select signals from said sequential scramble decoder or from said interleaved scramble decode.

14. The SDRAM of claim 13 wherein said sequential scramble decoder and said interleaved scramble decoder provide bit select signals responsive to said block count.

15. A Synchronous Dynamic Random Access Memory (SDRAM), having a plurality of memory banks, each said memory bank having a decoder for selecting an accessed n bit block of data, n being an integer divisible by 2, said decoder comprising:

a pass gate column decoder for decoding an array column address;

a plurality of pass gate bit selectors, said decoded column address selecting n of said plurality of bit selectors, each selected said bit selector selecting a bit pair;

a pass gate starting address decoder for selecting an n-bit block of bits, each bit of said selected n-bit block being selected from one of said bit pairs selected by said bit selector;

a modulo n counter for maintaining a block count, said modulo n counter being n serially connected Master-Slave latches; and a high speed decoder/register for receiving and latching said selected n-bit block and for holding a previously selected block of data, each bit in said previously selected block of data responsive to said block count.

16. The SDRAM of claim 15 wherein the high speed decoder/register comprises:

a sequential scramble decoder;

an interleaved scramble decoder;

at least a first n bit register serially connected to a second n bit register; and an AND-OR decoder receiving data from said second of said serially connected n-bit registers and providing selected outputs therefrom responsive to bit select signals from said sequential scramble decoder or from said interleaved scramble decode.

17. The SDRAM of claim 16 said sequential scramble decoder and said interleaved scramble decoder providing bit select signals responsive to said block count.

* * * * *